United States Patent
Chen et al.

(10) Patent No.: US 7,598,771 B2
(45) Date of Patent: Oct. 6, 2009

(54) LEVEL SHIFTER FOR GATE DRIVER

(75) Inventors: Hung-Chun Chen, Hsinchu (TW);
Ko-Yu Chiang, Hsinchu (TW);
Chen-Pang Kung, Taoyuan County
(TW); Ming-Daw Chen, Hsinchu (TW)

(73) Assignee: Industrial Technology Research Institute, Hsinchu (TW)

( * ) Notice: Subject to any disclaimer, the term of this patent is extended or adjusted under 35 U.S.C. 154(b) by 75 days.

(21) Appl. No.: 12/024,113

(22) Filed: Feb. 1, 2008

(65) Prior Publication Data
US 2008/0186058 A1 Aug. 7, 2008

(30) Foreign Application Priority Data
Feb. 2, 2007 (TW) .............................. 96103859 A

(51) Int. Cl.
*H03K 19/0175* (2006.01)
(52) U.S. Cl. .......................................... 326/80; 326/68
(58) Field of Classification Search .................. 326/62, 326/63, 68, 80–83; 377/64
See application file for complete search history.

(56) References Cited

U.S. PATENT DOCUMENTS 6,064,713 A   5/2000  Lebrun et al.
6,339,631 B1*  1/2002  Yeo et al. ...................... 377/64

FOREIGN PATENT DOCUMENTS

KR   1020060029389   4/2006
KR   1020070002530   1/2007

* cited by examiner

*Primary Examiner*—James H. Cho
*Assistant Examiner*—Crystal L Hammond
(74) *Attorney, Agent, or Firm*—Jianq Chyun IP Office

(57) ABSTRACT

A level shifter for a gate driver has a driving transistor, a reset transistor, a charge/discharge circuit, a threshold voltage detector, and a memory capacitor. An initial threshold voltage of the driving transistor is detected by the threshold voltage detector, and then memorized in the memory capacitor. The charge/discharge circuit charges or discharges the capacitor, and receives a control signal to actuate the level shifter. The reset transistor receives an output signal of a next stage level shifter as a reset signal, so as to restore the initial status of the level shifter. In this way, the driving current output from the level shifter is irrelevant to the threshold voltage of the driving transistor.

27 Claims, 16 Drawing Sheets

LEVEL SHIFTER FOR GATE DRIVER

CROSS-REFERENCE TO RELATED APPLICATION

This application claims the priority benefit of Taiwan application serial no. 96103859, filed on Feb. 2, 2007. The entirety of the above-mentioned patent application is hereby incorporated by reference herein and made a part of this specification.

BACKGROUND OF THE INVENTION

1. Field of the Invention

The present invention relates to a gate driver, in particular, to a gate driver capable of compensating a threshold voltage of a transistor.

2. Description of Related Art

In recent years, thin film transistor (TFT) gradually develops from a mere pixel switch to circuitry applications, and this trend can be learned about from publications in international symposiums. Uniformity and properties of TFT have been improved year after year. However, it is in urgent need of employing some methods such as component structure design, circuit compensation design, and system adjustment to eliminate an inherent defect, i.e., poor reliability, of the TFT. As for a gate driver, the circumstance that a gate of an individual TFT is biased for a long time should be avoided, in order to output a stable scan voltage.

U.S. Pat. No. 6,064,713 discloses a method of forming a gate driver by using an amorphous silicon thin-film transistor (a-Si TFT). In this patent, an output signal of a next stage is used to achieve reset, an output of a preceding stage is adopted as a driving signal, and a capacitor is employed to enhance a signal. The advantage of this patent is that each TFT is biased for a short time, and thus an increase of a threshold voltage is not easily risen when the TFT is biased. However, the disadvantage of this patent is that, a driver TFT in the gate driver might be failed as the threshold voltage gradually rises due to threshold voltage accumulation. Therefore, the lifetime of the gate driver will be restricted.

Therefore, it is an urgent need of solutions in the industry to effectively improve the drive stability and prolong the lifetime of a driver.

SUMMARY OF THE INVENTION

Accordingly, the present invention provides a level shifter for a gate driver, which employs a capacitor to memorize a threshold voltage of a driving transistor, so as to compensate the attenuation of a driving voltage, and eliminate noises and offsets of the threshold voltage, thereby significantly enhancing the stability of a drive circuit.

The present invention provides a level shifter, in which multiple stages of the level shifters are suitable to be serially-connected into a gate drive circuit, each stage has an output end coupled to an input end of a next stage level shifter, and a reset end for receiving an output signal of the next stage level shifter.

The level shifter provided by the present invention can comprise a first node and a second node, a driving transistor, a reset transistor, a charge/discharge circuit, a threshold voltage detector, and a memory capacitor. The driving transistor has a gate, a source, and a drain. The gate is coupled to the first node, the drain is coupled to a clock signal, and the source functioning as an output end of the level shifter outputs an output signal to an input end of a next stage level shifter. The reset transistor has a gate, a source, and a drain. The gate receives an output signal of the next stage level shifter as a reset signal, the source is coupled to a first low-potential voltage, and the drain is coupled to the first node. The charge/discharge circuit receives an input signal and a control signal, and is coupled to the second node. The threshold voltage detector receives the control signal and is coupled to the first node and the source of the driving transistor. The memory capacitor has a first end and a second end respectively coupled to the first node and the second node, so as to memorize a threshold voltage of the driving transistor.

The invention further provides a level shifter, comprising a driving transistor, a reset transistor, a charge circuit, a threshold voltage detector, and a memory capacitor is further provided. The driving transistor comprises a gate, a source, and a drain. The gate is coupled to a first node, the drain coupled to a clock signal, and the source functioning as an output end outputs an output signal. The reset transistor has a gate, a source, and a drain. The gate receives an output signal from a next stage level shifter as a reset signal, the source is coupled to a low-potential voltage, and the drain is coupled to the first node. The charge circuit receives an input signal, and is coupled to a second node. The threshold voltage detector receives a control signal, and is coupled to the first node, the second node, and the source of the driving transistor. The memory capacitor has a first end and a second end respectively coupled to the first node and the second node, so as to memorize a threshold voltage of the driving transistor.

The invention further provides a level shifter, comprising a driving transistor, a reset transistor, a charge/discharge circuit, a threshold voltage detector, and a memory capacitor is also provided. The driving transistor has a gate, a source, and a drain. The gate is coupled to a first node, the drain is coupled to a clock signal, and the source functioning as an output end outputs an output signal. The reset transistor has a gate, a source, and a drain. The gate receives an output signal from a next stage level shifter as a reset signal, the source is coupled to a first low-potential voltage, and the drain is coupled to the first node. The charge/discharge circuit receives an input signal, a first control signal, and a second control signal, and is coupled to a second low-potential voltage and a second node. The threshold voltage detector receives the first control signal and the second control signal, and is coupled to the first node and the source of the driving transistor. The memory capacitor has a first end and a second end respectively coupled to the first node and the second node, so as to memorize a threshold voltage of the driving transistor.

Moreover, the above threshold voltage detector can further comprise a fourth transistor, a fifth transistor, and a sixth transistor. The fourth transistor has a gate, a source, and a drain. The gate is coupled to the first control signal, the drain is coupled to a high-potential voltage, and the source is coupled to a first node. The fifth transistor has a gate, a source, and a drain. The gate is coupled to the second control signal, and the source is coupled to the first node. The sixth transistor has a gate, a source, and a drain. The gate is coupled to the first node and the gate of the driving transistor, the drain is coupled to the drain of the fifth transistor, and the source is coupled to the source of the driving transistor. In addition, the drain and the gate of the fourth transistor can be coupled together, and then coupled to the first control signal.

According to the aforementioned architectures, since a memory capacitor is employed to memorize a threshold voltage of a driving transistor before the activation of the level shifter, changes of the threshold voltage in the output signal can be avoided. Thereby, the output signals of the driving voltage and driving current are nearly irrelevant to the threshold voltage of the driving transistor, and the driving voltage can be well compensated. As such, a stable drive is achieved, which will lead to a more stable display.

In order to make the aforementioned and other objectives, features, and advantages of the present invention comprehensible, embodiments accompanied with figures are described in detail below.

BRIEF DESCRIPTION OF THE DRAWINGS

The accompanying drawings are comprised to provide a further understanding of the invention, and are incorporated in and constitute a part of this specification. The drawings illustrate embodiments of the invention and, together with the description, serve to explain the principles of the invention.

DESCRIPTION OF THE EMBODIMENTS

Figure 1:
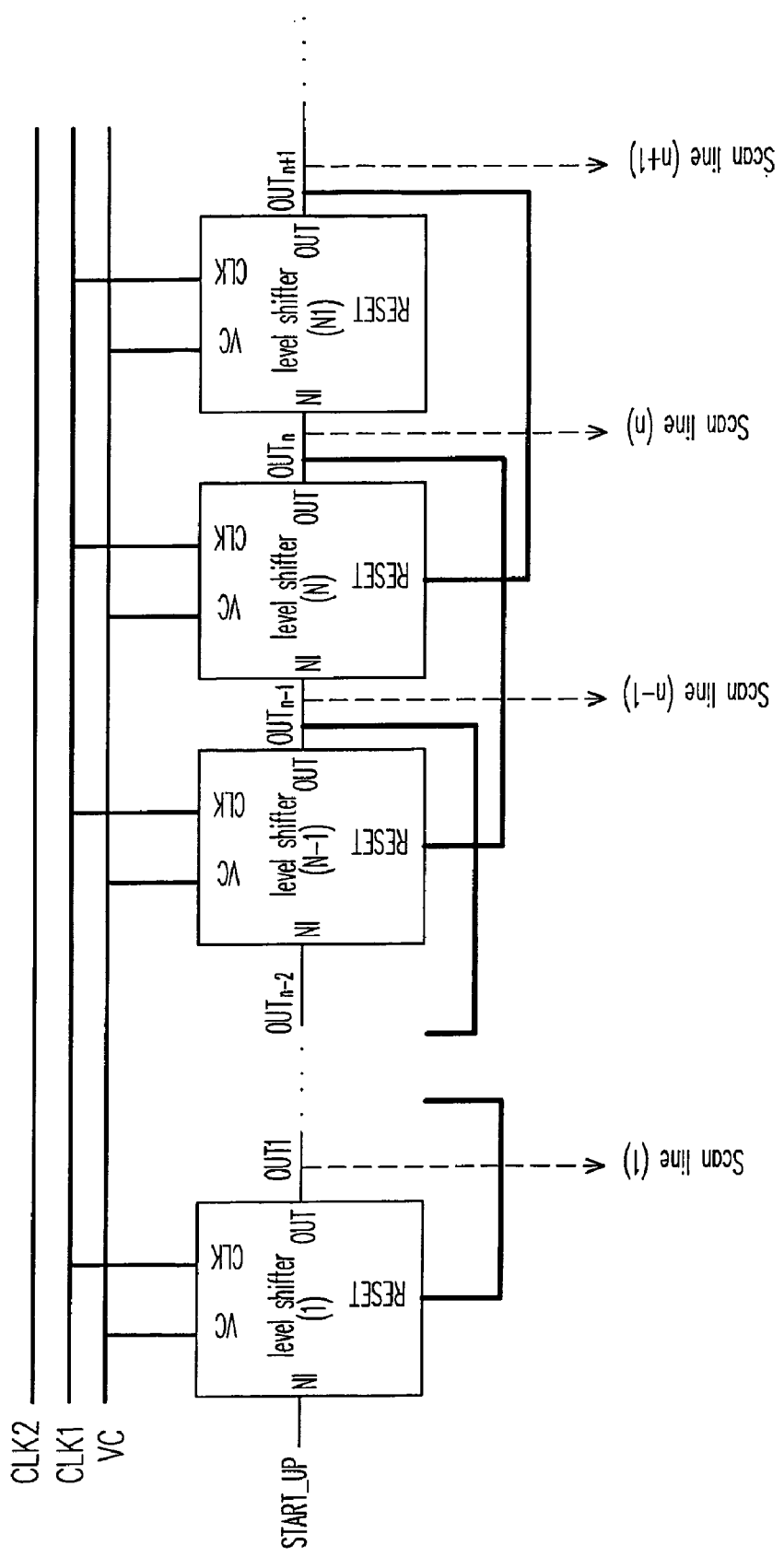
FIG. 1 is a schematic view of a gate driver according to the present invention.

Reference will now be made in detail to the present embodiments of the invention, examples of which are illustrated in the accompanying drawings. Wherever possible, the same reference numbers are used in the drawings and the description to refer to the same or like parts.

If a TFT is subjected to a gate bias stress for a long time, the threshold voltage $V_{th}$ thereof will be drifted, resulting in a drop of the driving current and degradation of the drive capability. The drift amount of the threshold voltage $V_{th}$ has certain relationship with the gate voltage $V_{GS}$, initial threshold voltage $V_{T0}$, and operation time t of bias. In order to reduce the drift amount of the voltage $V_{th}$ and to fix the driving current during increase of the voltage $V_{th}$, the present invention adopts a memory capacitor to memorize the threshold voltage of the driver TFT.

FIG. 1 is a schematic view of a gate driver according to the present invention. The gate driver is generally a circuit constituted by a plurality of serially-connected level shifters. FIG. 1 shows three stages (N−1, N, and N+1) as an example for illustration. According to this embodiment, each level shifter comprises an input end IN, an output end OUT and a reset end RESET, and receives an external control signal $V_C$ and clock signals CLK1, CLK2. The input end IN of a first stage level shifter receives a start signal (START_UP), and an output of each stage is connected to a scan line and functions as an input signal of an input end IN of a next stage level shifter. An output signal of each stage is fedback to the reset end RESET of the preceding stage. For example, an output signal OUTn of the N-th stage is fedback to the reset end RESET of the (N−1)-th stage. A signal received by the reset end RESET of each stage can restore the threshold voltage of each stage driving transistor to its initial status. The structure and operation of each stage level shifter will be illustrated in detail below.

Figure 2A:
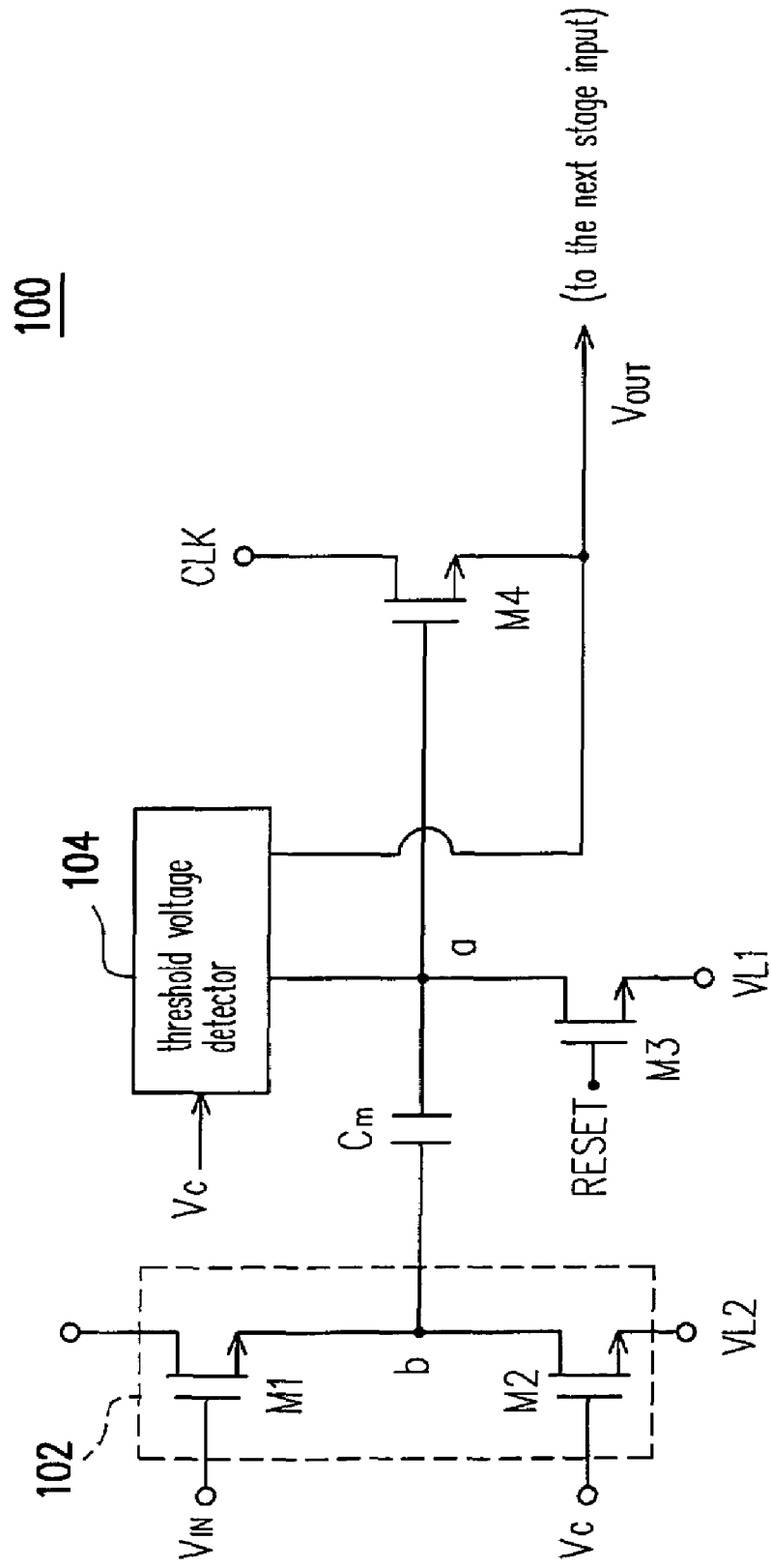
FIG. 2A is a schematic circuit diagram of the level shifter in FIG. 1.

FIG. 2A is a schematic view of one stage level shifter in the gate drive circuit of this embodiment. As shown in FIG. 2A, the level shifter 100 comprises a charge/discharge circuit 102, a memory capacitor Cm, a threshold voltage detector 104, a reset transistor M3, and a driving transistor M4. In this embodiment, the charge/discharge circuit 102 farther comprises serially-connected transistors M1 and M2.

As shown in FIG. 2A, a gate of the transistor M1 receives an input voltage $V_{IN}$, and a gate of the transistor M2 receives a control signal $V_C$. A drain of the transistor M1 is further connected to a high-potential voltage $V_H$, and a source thereof is connected to a second node b. A source of the transistor M2 is further connected to a second low-potential voltage $V_{L2}$, and a drain thereof is connected to the second node b. The memory capacitor Cm is connected between the nodes a and b, and can be a transistor-based capacitor or a metal-insulator-metal capacitor. A gate of the reset transistor M3 receives a reset signal RESET, a drain is connected to the first node a, and a source is connected to a first low-potential voltage $V_{L1}$. The threshold voltage detector 104 receives the control voltage $V_C$, and is coupled to the first node a and an output voltage $V_{OUT}$. A gate of the driving transistor M4 is coupled to the first node a, the drain receives a clock signal CLK, and the source functioning as an output is connected to the output voltage $V_{OUT}$.

Figure 3:
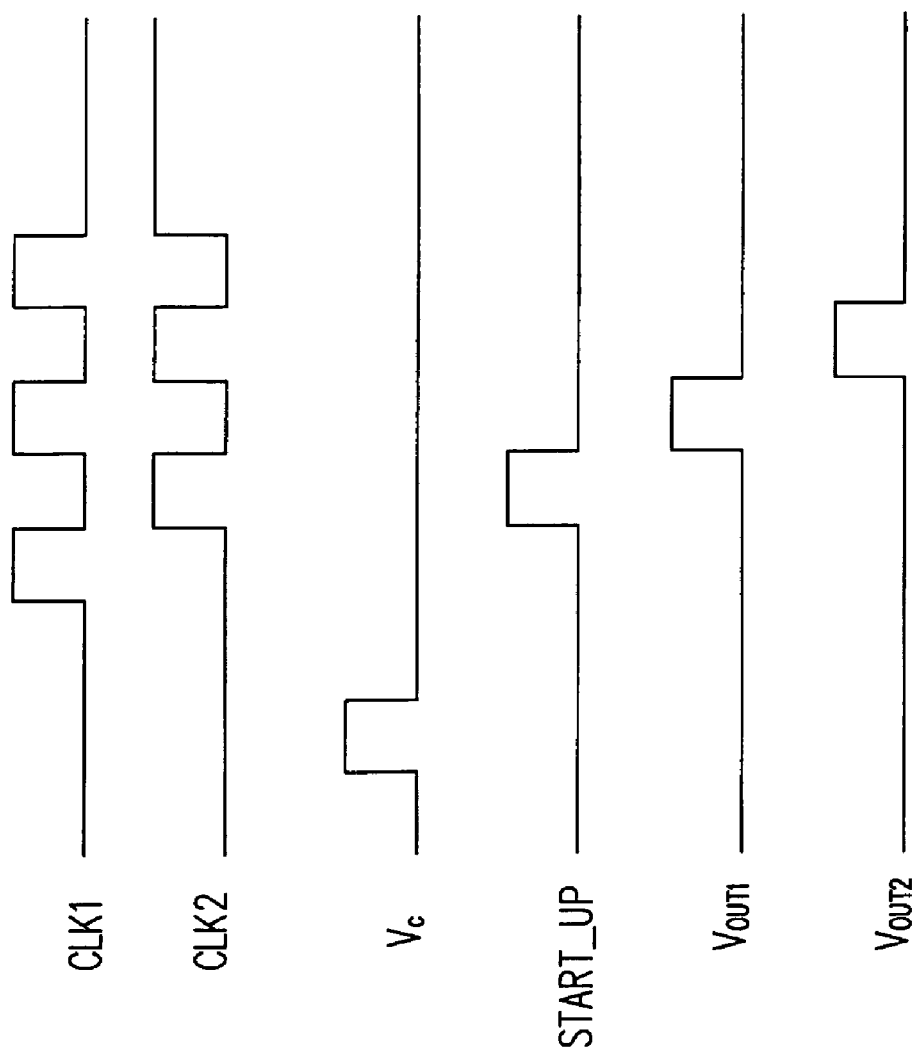
FIG. 3 is a schematic view of the operation timing of the circuit in FIG. 2A.

Next, the operation mode of this embodiment is illustrated with reference to the circuit diagram in FIG. 2A and a timing chart in FIG. 3. The level shifter 100 initially employs the threshold voltage detector 104 to detect the threshold voltage $V_{th}$ of the driving transistor M4. When the control signal $V_C$ changes to be at a high potential, the threshold voltage $V_{th}$ of the driving transistor M4 will be stored in the memory capacitor Cm. Subsequently, when a start signal START_UP (the signal input into the input end IN of the first stage) is input in the first stage level shifter as the input signal $V_{IN}$, the transistor M1 will be turned on. Therefore, the second node b is charged to $V_H$, and meanwhile the voltage at the first node a is increased, in which the voltage increment is about $V_H$.

At this point, the voltage at the first node a changes to $(V_H+V_{th})$, i.e., the previously memorized threshold voltage $V_{th}$ of the driving transistor M4 is added to a charged voltage level. Further, an equivalent driving voltage of the driving transistor M4 is $V_{GS}-V_{th}$. If it is assumed that the voltage $V_{OUT}$ is 0, an equivalent driving voltage of the output current is irrelevant to the threshold voltage $V_{th}$. Afterwards, when the clock signal CLK changes to be at a high potential, the output end OUT is charged through the driving transistor M4 to be at a high potential, till the clock signal CLK changes from a high potential to a low potential, and the output end OUT is also discharged through the driving transistor M4.

When the output signal of an output end OUTn+1 of the next stage level shifter changes from a low potential to a high potential, the output signal of the output end OUTn+1 is fedback to the transistor M3 in the circuit of this stage to discharge the node a to a low potential $V_{L1}$, so that the circuit of the level shifter is restored to its initial status.

Figure 2B:
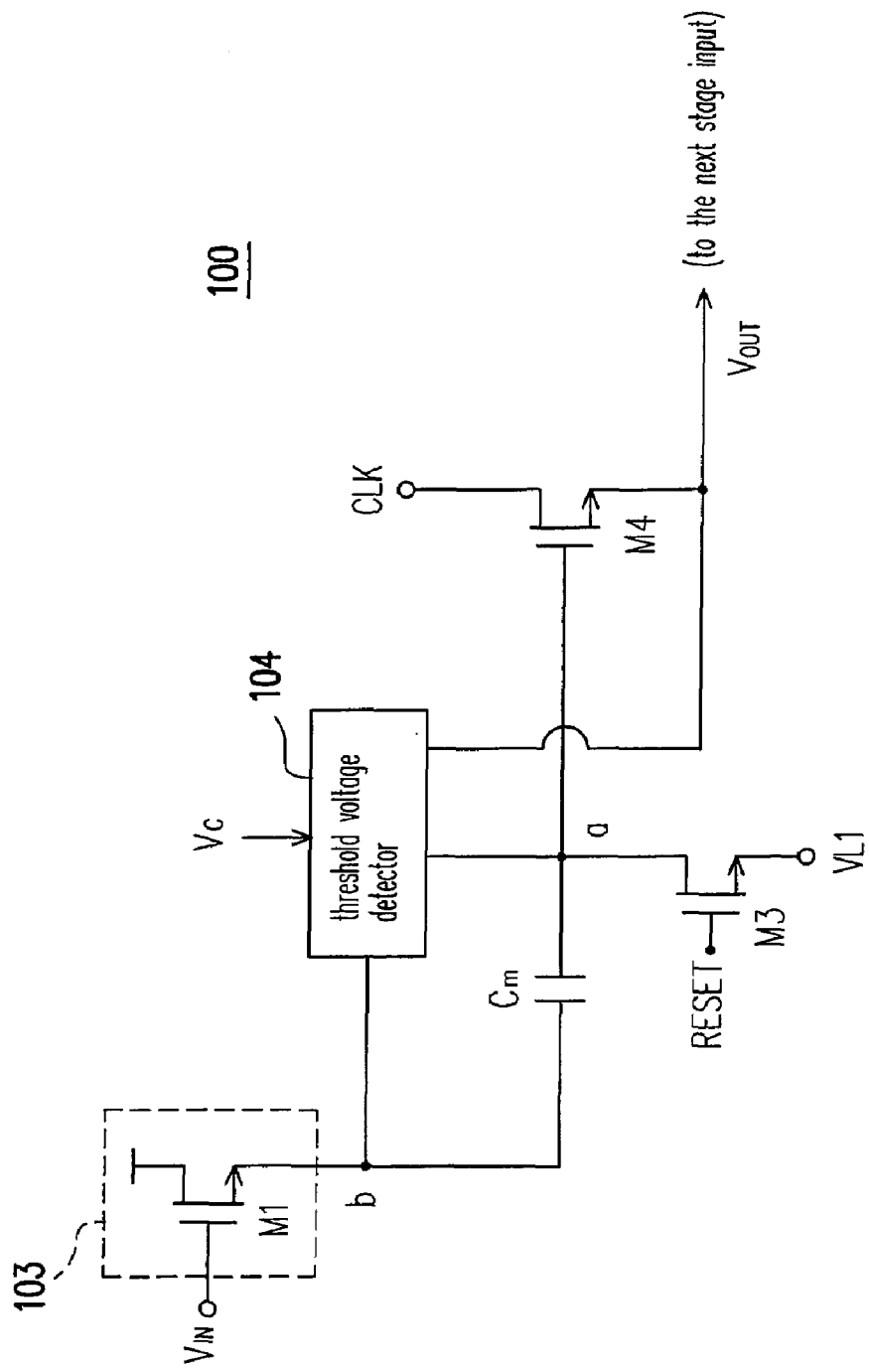
FIG. 2B is a schematic view showing a variation of the level shifter in FIG. 2A.

FIG. 2B is a schematic view of one stage level shifter in the gate drive circuit according to another embodiment. This embodiment is different from that of FIG. 2A in the following aspect. The charge/discharge circuit in FIG. 2A is replaced with a charge circuit 103 used for receiving an input signal $V_{IN}$ and coupled to the second node b. The threshold voltage detector 104 receives the control signal $V_C$, and is coupled to the first node a, the second node b, and the source of the driving transistor M4. The charge circuit 103 charges the memory capacitor Cm via the node b. The operating mode of the whole circuit is similar to that in FIG. 2A, and will not be repeated herein again.

Figure 2C:
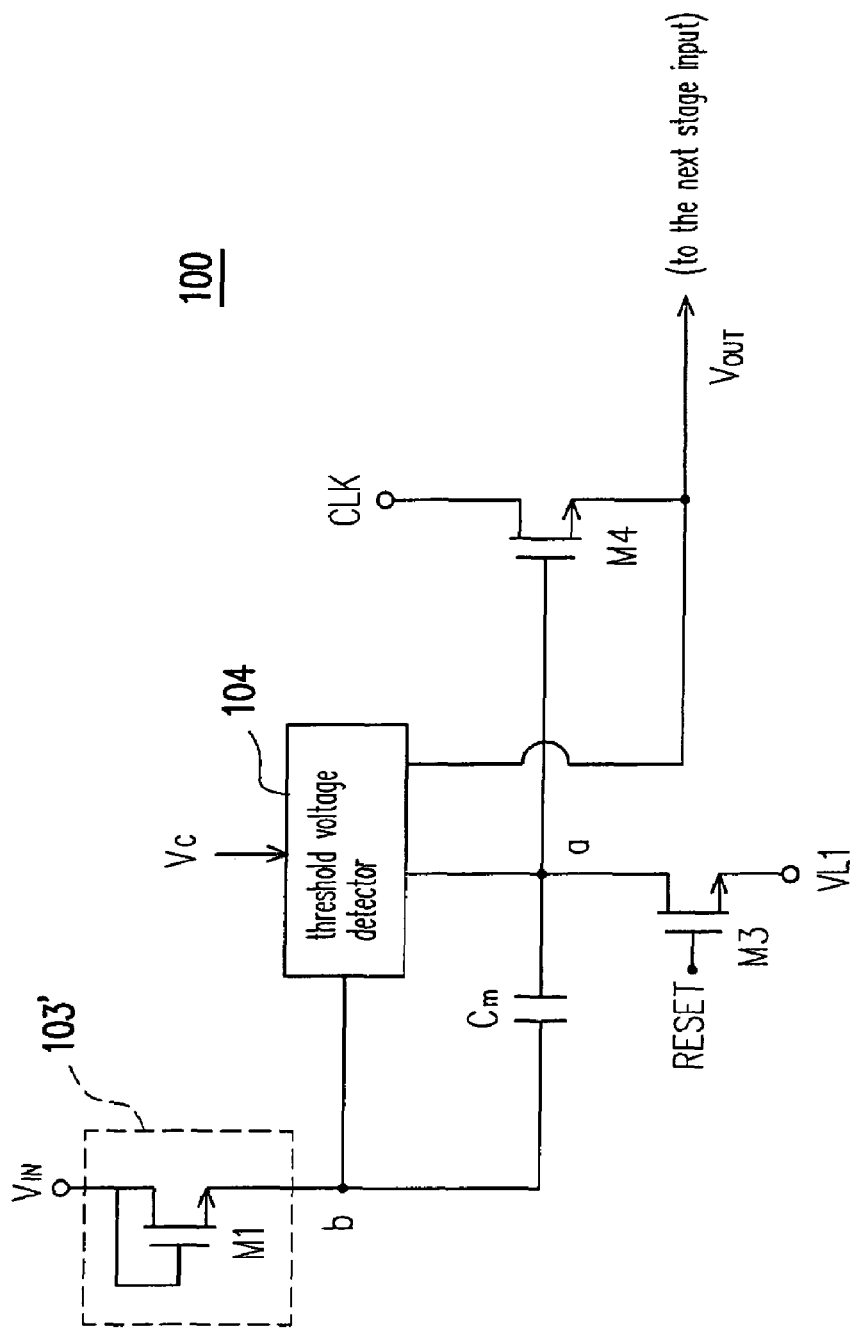
FIG. 2C is a schematic view showing a variation of the level shifter in FIG. 2B.

As shown in FIG. 2B, for example, the charge circuit 103 is formed by the transistor M1. The gate of the transistor M1 receives the input signal $V_{IN}$, the source is connected to the node b, and the drain is connected to a high-potential voltage $V_H$ (similar to FIG. 2A). Further, referring to FIG. 2C, an example of another charge circuit 103' is shown. Substantially, the charge circuit 103' is also formed by the transistor M1, except that the gate and the drain of the transistor M1 in FIG. 2C are connected for receiving the input signal $V_{IN}$.

Figure 4:
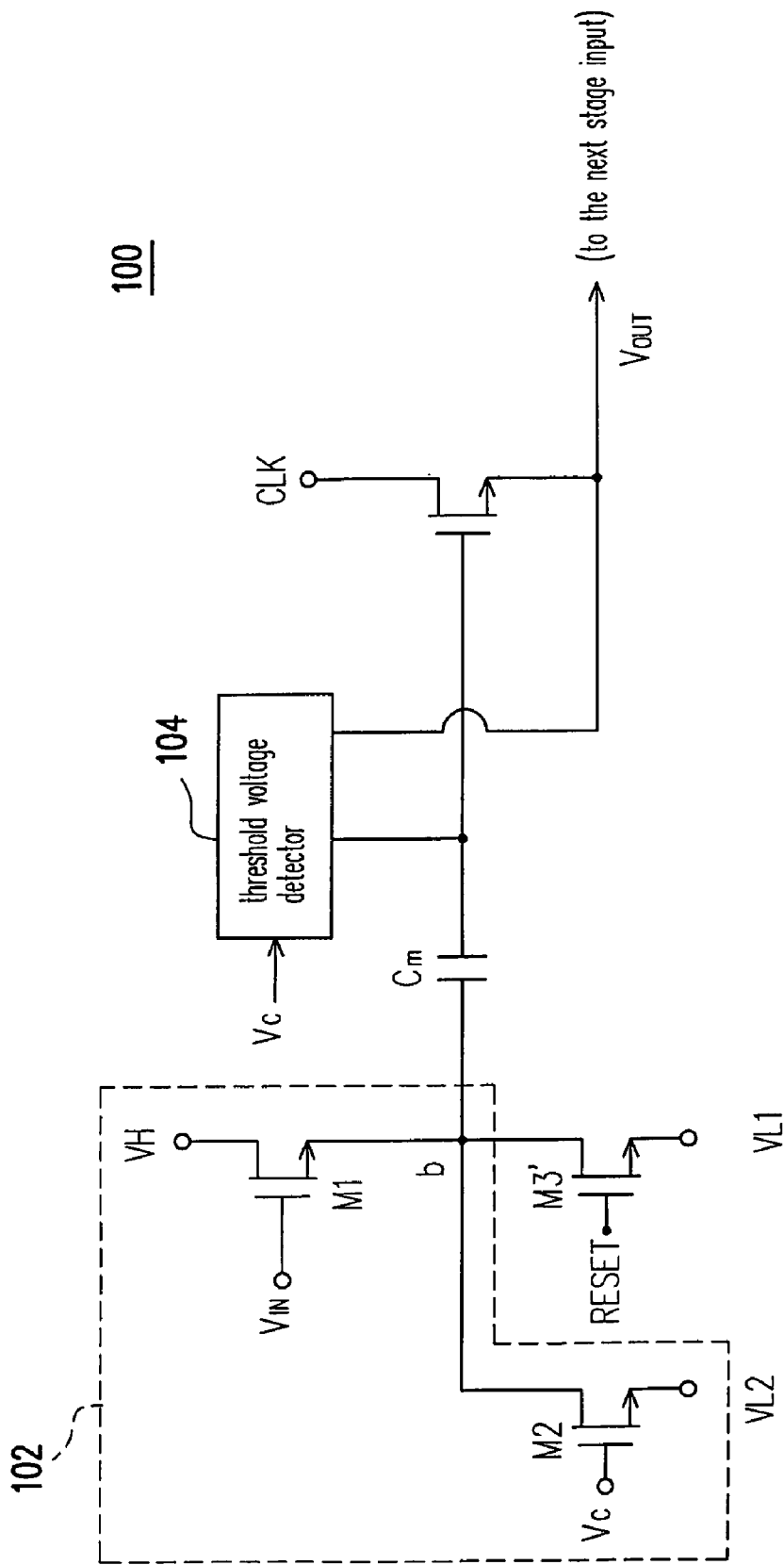
FIG. 4 is a schematic view showing a variation of the level shifter in FIG. 2A.

FIG. 4 is a schematic view showing a variation of the level shifter in FIG. 2A. FIG. 4 is different from FIG. 2A in the connection position of the reset transistor M3'. As shown in FIG. 4, a source of the reset transistor M3' is connected to the second node b, and except this, the architecture and operating mode are similar to those of FIG. 2A. Further, the drain of the transistor M1 can not be connected to the high-potential voltage $V_H$, but to the gate. That is, the input voltage $V_{IN}$ is input into the gate and the drain of the transistor M1.

Figure 5:
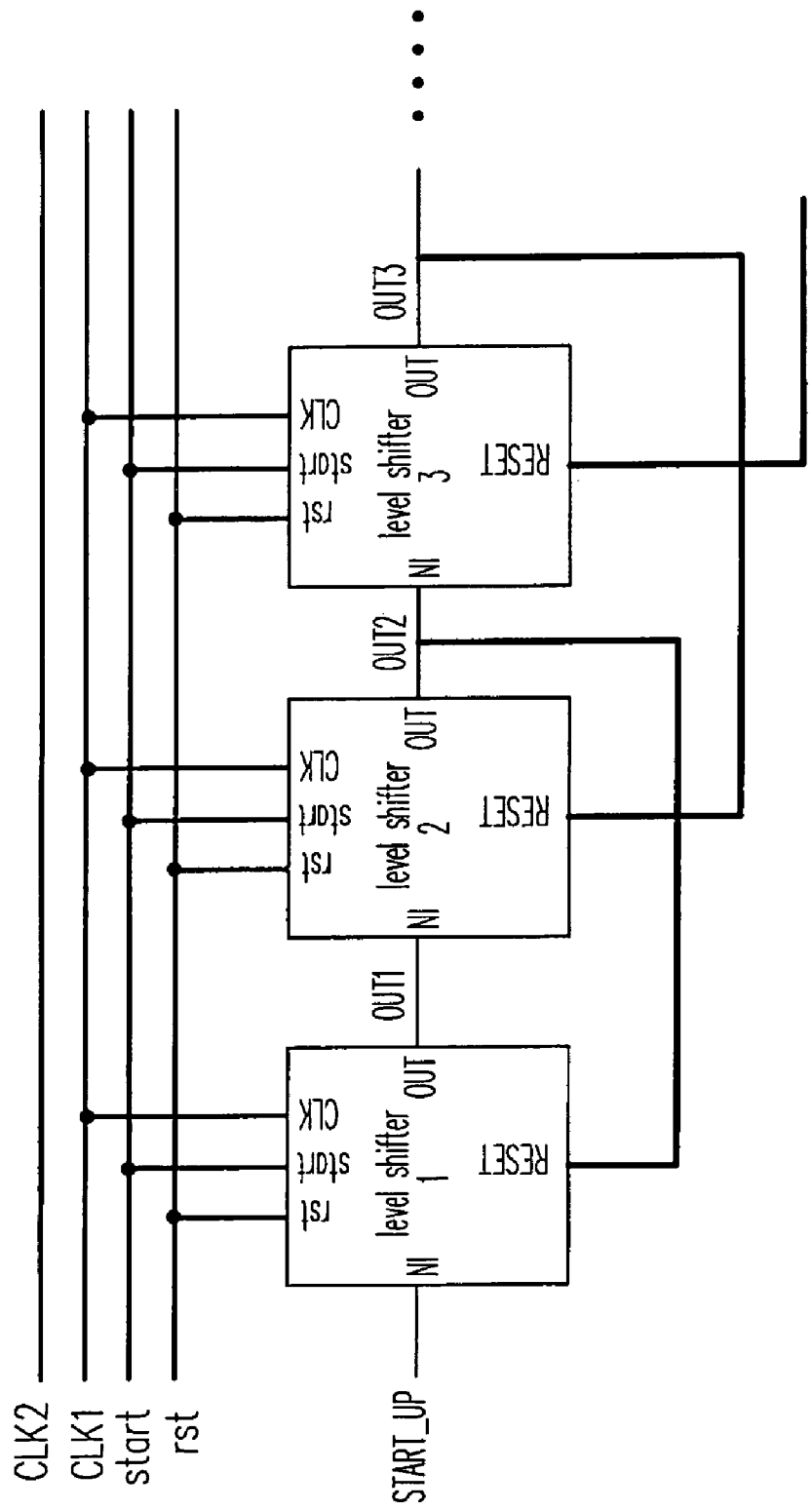
FIG. 5 is a schematic view of another gate driver according to the present invention.
Figure 7:
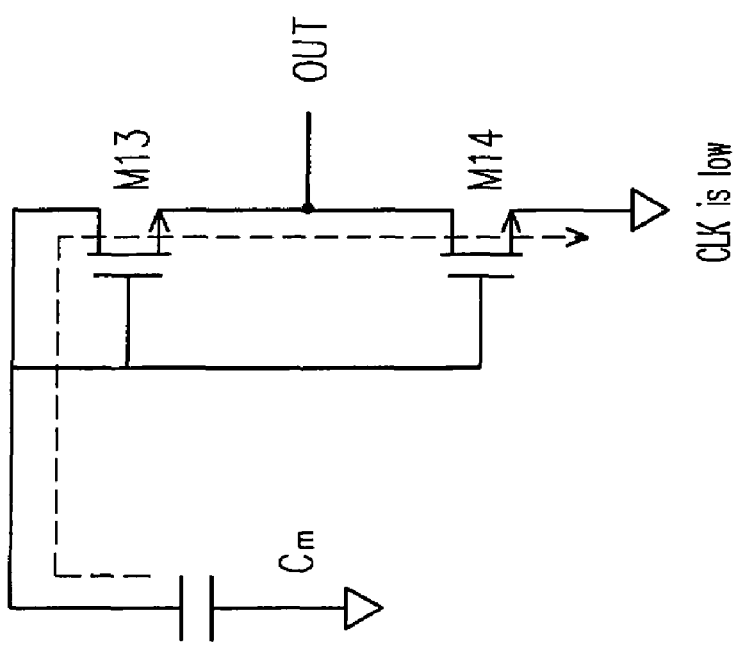
FIG. 7 is a schematic view of a discharge path of a threshold voltage detector.
Figure 8:
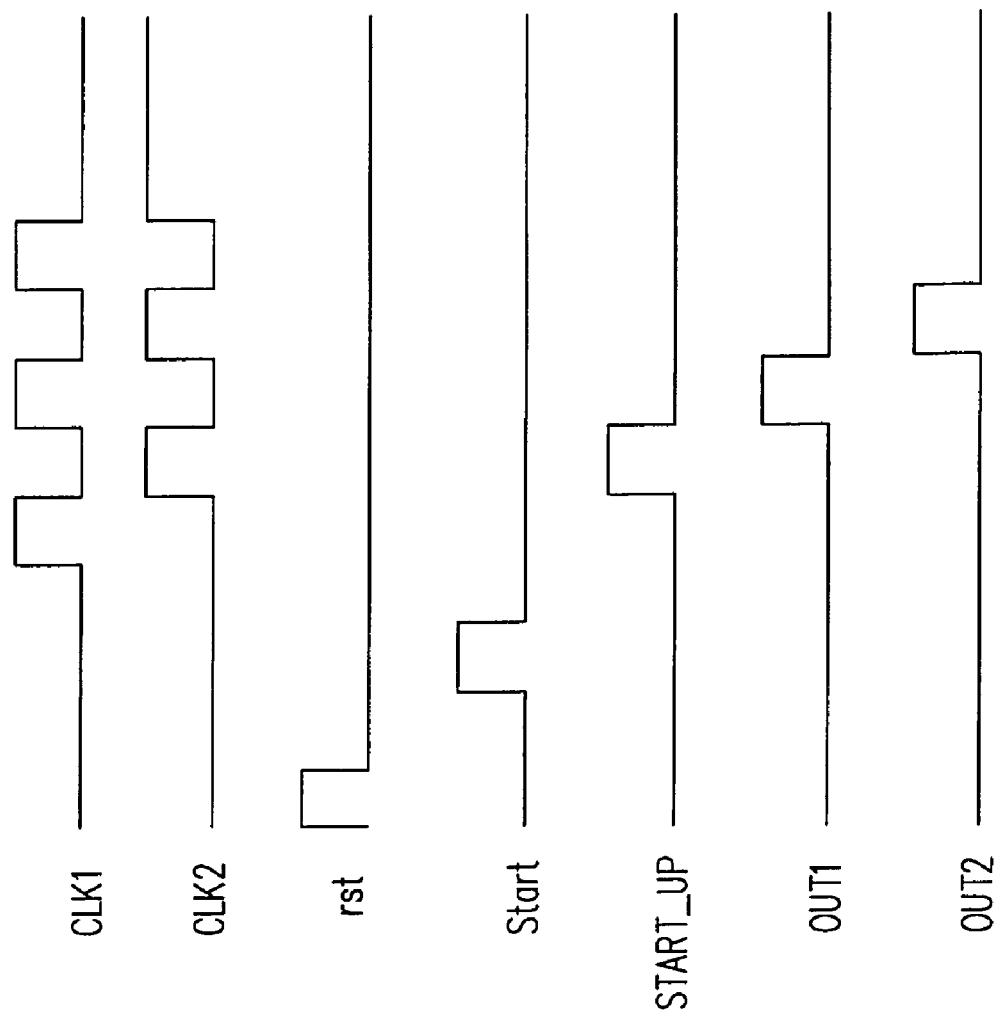
FIG. 8 is a schematic view of the operation timing of the circuit diagram in FIG. 6.

Architecture and operation of another embodiment are described with reference to FIGS. 5 to 8. FIG. 5 is a schematic view of another gate driver according to the present invention, FIG. 6 is a schematic circuit diagram of the level shifter in FIG. 5, FIG. 7 is a schematic view of a discharge path of a threshold voltage detector, and FIG. 8 is a schematic view of the operation timing of the circuit in FIG. 6.

As shown in FIG. 5, the gate driver of this embodiment is basically similar to the circuit in FIG. 1, but the control signal is further divided into a first control signal rst and a second control signal start. Except that, the other contents are similar to FIG. 1, and will not be repeated herein again.

The circuit architecture of this embodiment is further illustrated below. As shown in FIG. 6, a driving transistor M14 has a gate, a source, and a drain. The gate is coupled to a first node Q, the drain is coupled to a clock signal CLK, and the source functioning as an output end (OUT) outputs an output signal $V_{OUT}$. The reset transistor M12 has a gate, a source, and a drain. The gate receives an output signal of the next stage level shifter as a reset signal RESET, the source is coupled to a first low-potential voltage $V_{L1}$, and the drain is coupled to the first node Q. A charge/discharge circuit 202 receives an input signal $V_{IN}$, the first control signal rst, and the second control signal start, and is coupled to a second low-potential voltage $V_{L2}$ and a second node x. Herein, the input signal $V_{IN}$ is a start signal START_UP for the first stage level shifter and an output signal of the preceding stage for the level shifter following the first stage. The threshold voltage detector 204 receives the first control signal rst and the second control signal start, and is coupled to the first node Q and the source of the driving transistor M14. The memory capacitor Cm has a first end and a second end respectively coupled to the first node Q and the second node x, so as to memorize a threshold voltage $V_{th}$ of the driving transistor M14.

Figure 6:
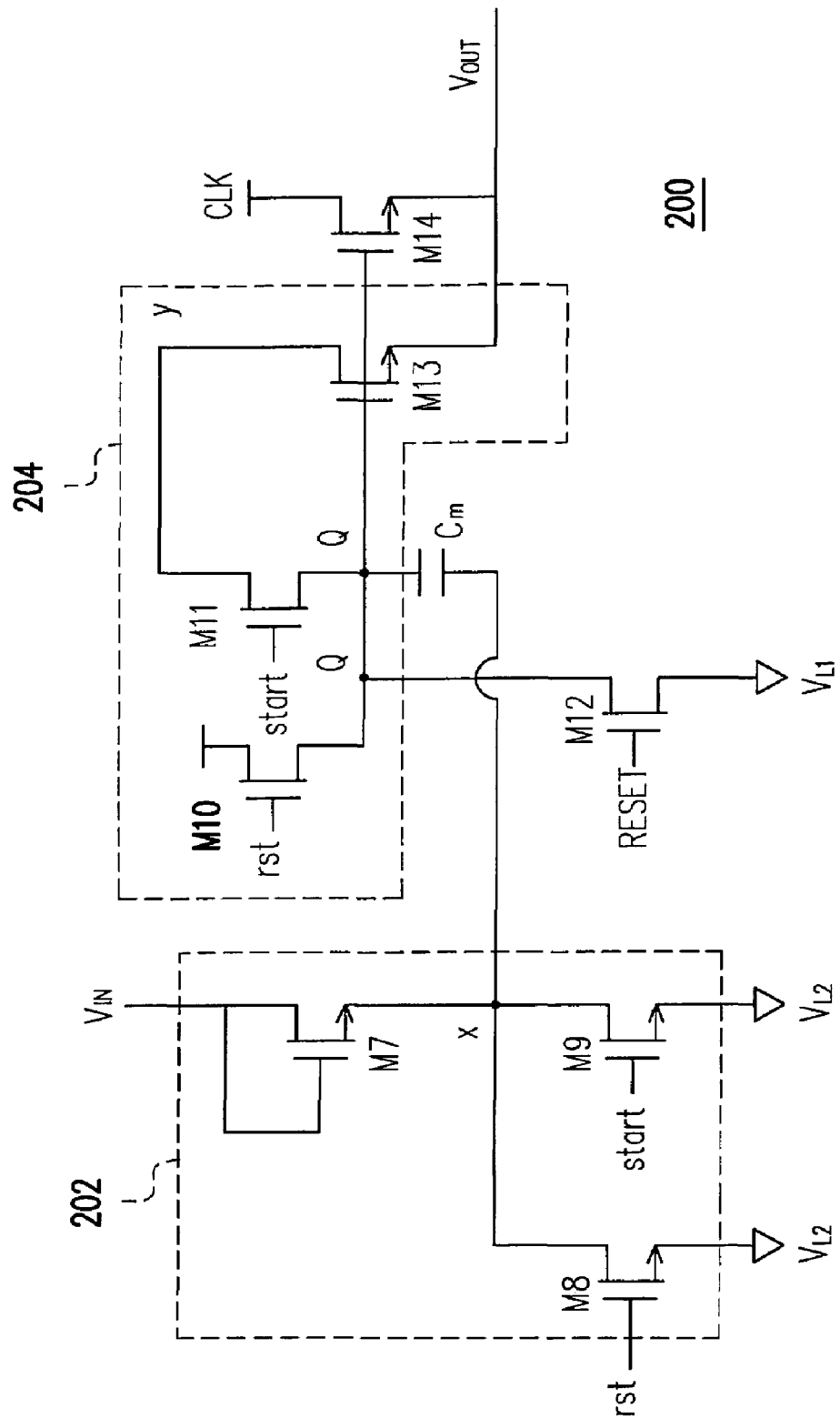
FIG. 6 a schematic circuit diagram of the level shifter in FIG. 5.

As shown in FIG. 6, for example, the charge/discharge circuit further comprises transistors M7, M8, and M9. The transistor M7 has a gate, a source, and a drain. The gate is coupled to the drain for receiving the input signal $V_{IN}$, and the source is coupled to the second node x. The transistor M8 has a gate, a source, and a drain. The gate is coupled to the first control signal rst, the drain is coupled to the second node x, and the source is coupled to the second low-potential voltage $V_{L2}$. The transistor M9 has a gate, a source, and a drain. The gate is coupled to the second control signal start, the drain is coupled to the second node x, and the source is coupled to the second low-potential voltage $V_{L2}$. The first low-potential voltage $V_{L1}$ and the second low-potential voltage $V_{L2}$ can be equal or different. Further, the sources of the transistors M8 and M9 can also be coupled to different low-potential voltages, respectively.

As shown in FIG. 6, for example, the threshold voltage detector further comprises transistors M10, M11, and M13. The transistor M10 has a gate, a source, and a drain. The gate is coupled to the first control signal rst, the drain is coupled to the high-potential voltage $V_H$, and the source is coupled to the first node Q. The transistor M11 has a gate, a source, and a drain. The gate is coupled to the second control signal start, and the source is coupled to the first node Q. The transistor M13 has a gate, a source, and a drain. The gate is coupled to the first node and the gate of the driving transistor M14, the drain is coupled to the drain of the transistor M11, and the source is coupled to the source of the driving transistor M14.

The operation of the circuit in the above embodiment is illustrated below with reference to a timing diagram shown in FIG. 8. In the aforementioned circuit of the level shifter, the transistors M8, M9, M10, M11, and M13 are used to compensate the threshold voltage. The first control signal rst first changes to be at a high potential. At this point, the transistors M10 and M8 are turned on. When the transistor M10 is turned on, the node Q will be charged to a high potential in advance. Thus, as the first control signal rst is at a high potential and the second control signal start is still at a low potential, the transistor M8 is turned on and the transistor M9 is turned off, such that the other end of the capacitor, i.e., the node x, will be grounded due to the ON of the transistor M8.

Next, after the first control signal rst changes to be at a low potential, the second control signal start changes from a low potential to a high potential. Thus, the transistors M8, M10 are turned off and the transistors M9, M11 are turned on. At this point, as shown in FIG. 7, charges stored in the memory capacitor Cm will be discharged through the transistors M11, M13, and M14, and CLK is now at a low voltage. When the discharge is finished, the voltage stored in the memory capacitor Cm is equal to the threshold voltage $V_{th}$ of the driving transistor M14, i.e., $V_Q$ (the voltage at the node Q)= $(V_{th})_{M14}$. After the second control signal changes from a high potential to a low potential, the clock signals CLK2 and CLK1 begin to be transmitted. At this point, the memory capacitor Cm finishes memorizing the threshold voltage $V_{th}$.

When the start signal START_UP is input into the input end IN of the first stage level shifter 200 (referring to FIG. 5), the gate driver is triggered to operate. Taking the first stage level shifter for example, the input end IN begins to input the start signal $V_{IN}$=START_UP, and the transistor M7 is turned on. The potential of the node x is raised by $\Delta V_x$. As charges in the capacitor are continuous, the potential at the node Q is also raised, and added with a potential $V_Q$ memorized in the memory capacitor Cm at the very beginning to obtain a new potential $V_Q'$, $V_Q' = \Delta V_Q + (V_{TH})_{M14}$. If $\Delta V_Q = V_Q' - V_Q$, $\Delta V_Q = \Delta V_x \times (Cm/C_T)$, where $C_T$ is the total capacitance at the node Q.

Subsequently, the clock signal CLK1 changes to be at a high potential, and the output end OUT, i.e., the source of the driving transistor M14, is charged to a high potential. Due to the gate-source capacitance (Cgs) coupling effect of the transistors M13 and M14, the potentials $V_Q'$ and $V_{OUT}$ are raised at the same time. Therefore, when the voltage $V_{OUT}$ is raised, $(V_Q' - V_{OUT})$ is almost unchanged. Thus, $(V_{GS})_{M14}$ (the gate-source voltage of the driving transistor M14) is equal to $(V_Q' - V_{OUT})$. In addition, as the driving transistor M14 is operated in a linear region, the current I can be expressed in the following formula.

$$I = k(W/L)[(V_{DS})_{M14} \times ((V_{GS})_{M14} - (V_{th})_{M14})]$$
$$= k(W/L)[(V_{DD} - V_{OUT}) \times (V_Q' - VOUT - (V_{th})_{M14})]$$

In the above formula, $V_{DD}$ is a high-potential voltage in the circuit. It can be clearly seen from the formula that, $-(V_{th})_{M14}$ is just balanced out with $(V_{th})_{M14}$ in $V_Q'$, such that the current of the gate driver is irrelevant to the threshold voltage $(V_{th})_{M14}$ of the driving transistor M14. The driving transistor M14 provides an output current till the clock signal CLK is changed from a high potential to a low potential, and the output end OUT is discharged through the driving transistor M14. Subsequently, the output signal output from the next stage output end OUTn+1 controls the reset transistor M12 to discharge the node Q, and turns off the driving transistor M14. As an appropriate interval exists when inputting the clock signals CLK1 and CLK2 of two adjacent level shifters, the output end OUT has enough time to be discharged.

Clearly, by using the circuit of the level shifter of this embodiment, the output driving current is irrelevant to the threshold voltage of the driving transistor, so that each stage gate driver can stably output the driving current to the pixel end or output a scan voltage to each scan line. Therefore, even if being biased for a long time, the gate driver can still output a stable scan voltage and a driving current. Therefore, the problem of threshold voltage drift can be effectively solved.

Figure 9:
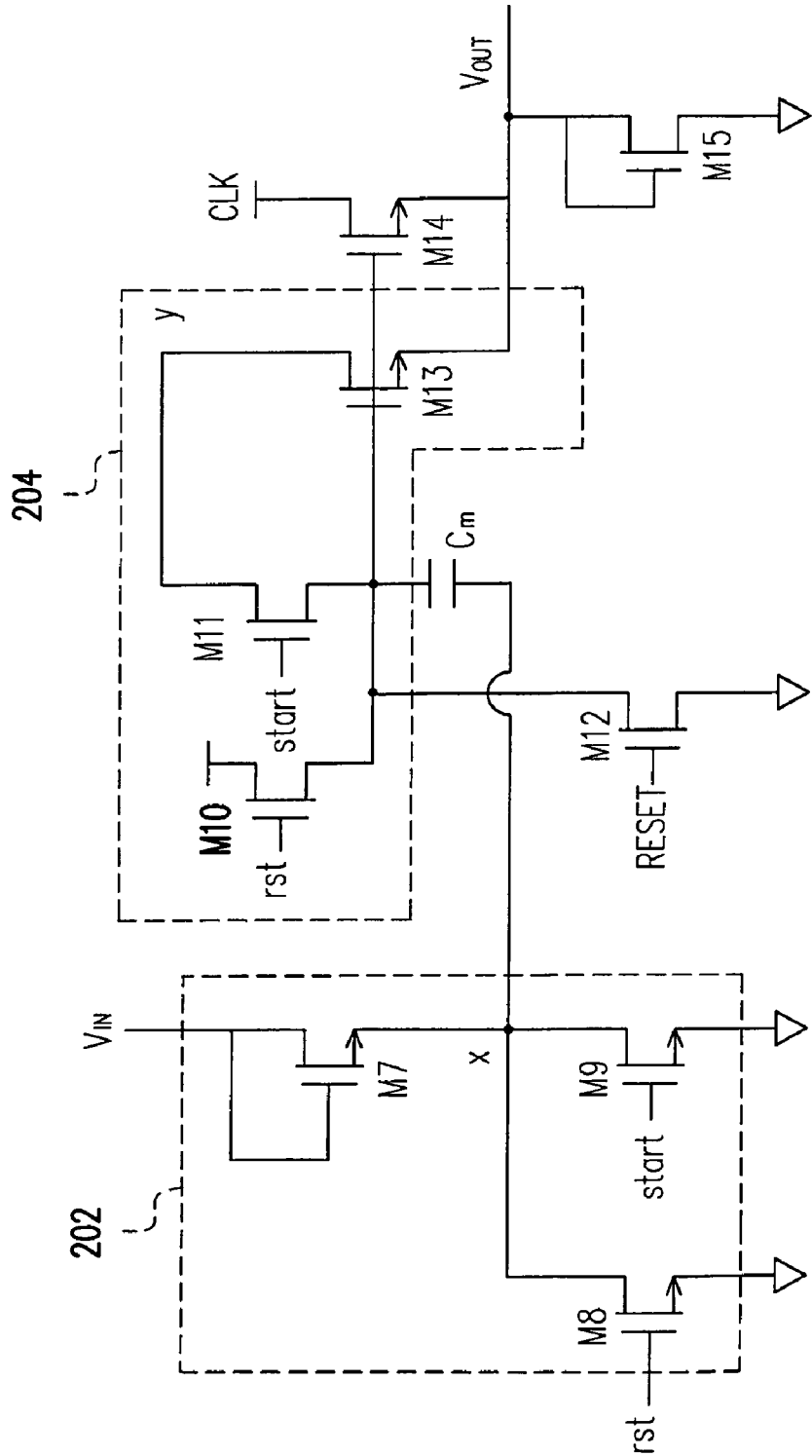
FIG. 9 is a schematic view showing a variation of the level shifter in FIG. 6.
Figure 10:
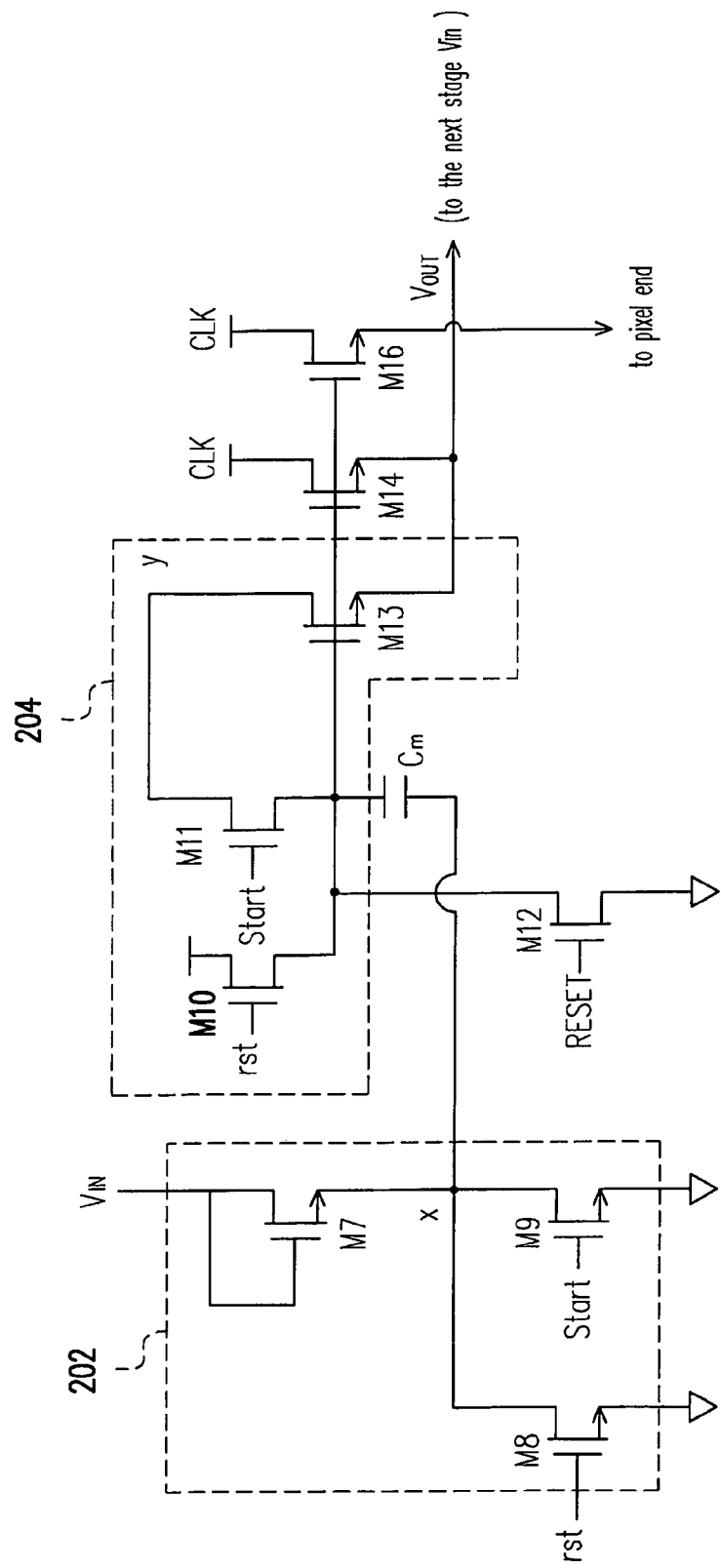
FIG. 10 is a schematic view showing another variation of the level shifter in FIG. 6.

The circuit in FIG. 6 can be further modified as shown in FIGS. 9 and 10. Referring to FIG. 9, the circuit in FIG. 6 further comprises a transistor M15 having a gate, a source, and a drain. The gate and the drain are both coupled to the source of the driving transistor M14. Further, referring to FIG. 10, the circuit in FIG. 6 further comprises a transistor M16 having a gate, a source, and a drain. The gate is coupled to the gate of the driving transistor M14, the drain is coupled to the clock signal CLK, and the source is coupled to a pixel end. Through this architecture, the DC bias of the output signal can become more stable.

Figure 11A:
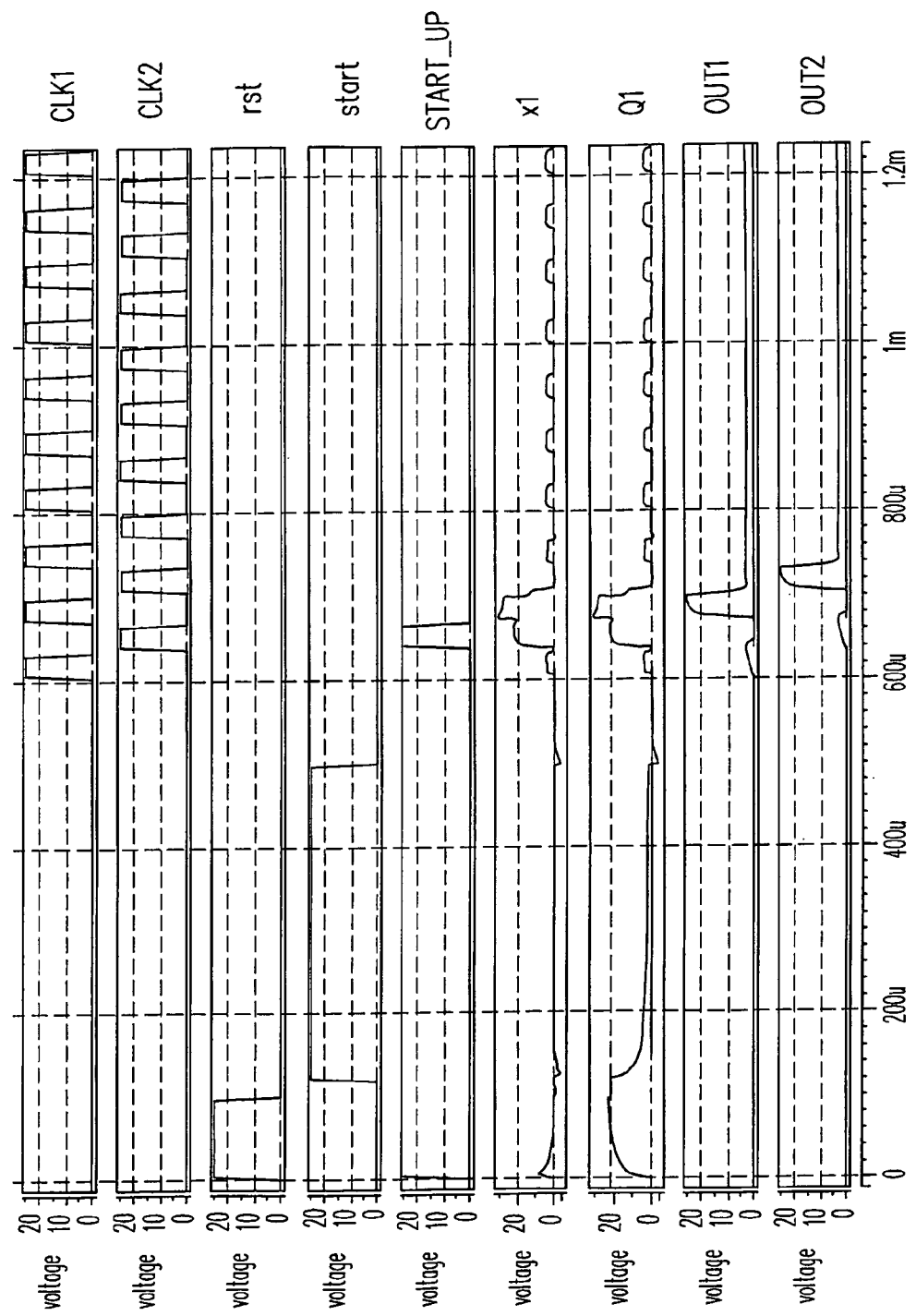
FIGS. 11A and 11B show simulation results with HSPICE software.
Figure 11B:

FIGS. 11A and 11B show results obtained by simulating the circuit in FIG. 6 with HSPICE software. The simulation is performed by using a model level 61 defined in the HSPICE. FIG. 11A shows a simulation result of a single-stage level shifter, and FIG. 11B shows the simulation result of ten stages of serially-connected level shifters. It can be seen from FIGS. 11A and 11B, after the start signal START_UP is inputted to enable the gate drivers, output waveforms (OUT1 to OUT10) of each stage are almost the same, so the drive capability of each stage maintains stable. The gate driver of this embodiment is applicable to WVGA specification, in which the refresh frequency is 60 Hz, the supply voltage is 25 V, and the amplitude of the output signal OUT is 24 V.

Figure 12A:
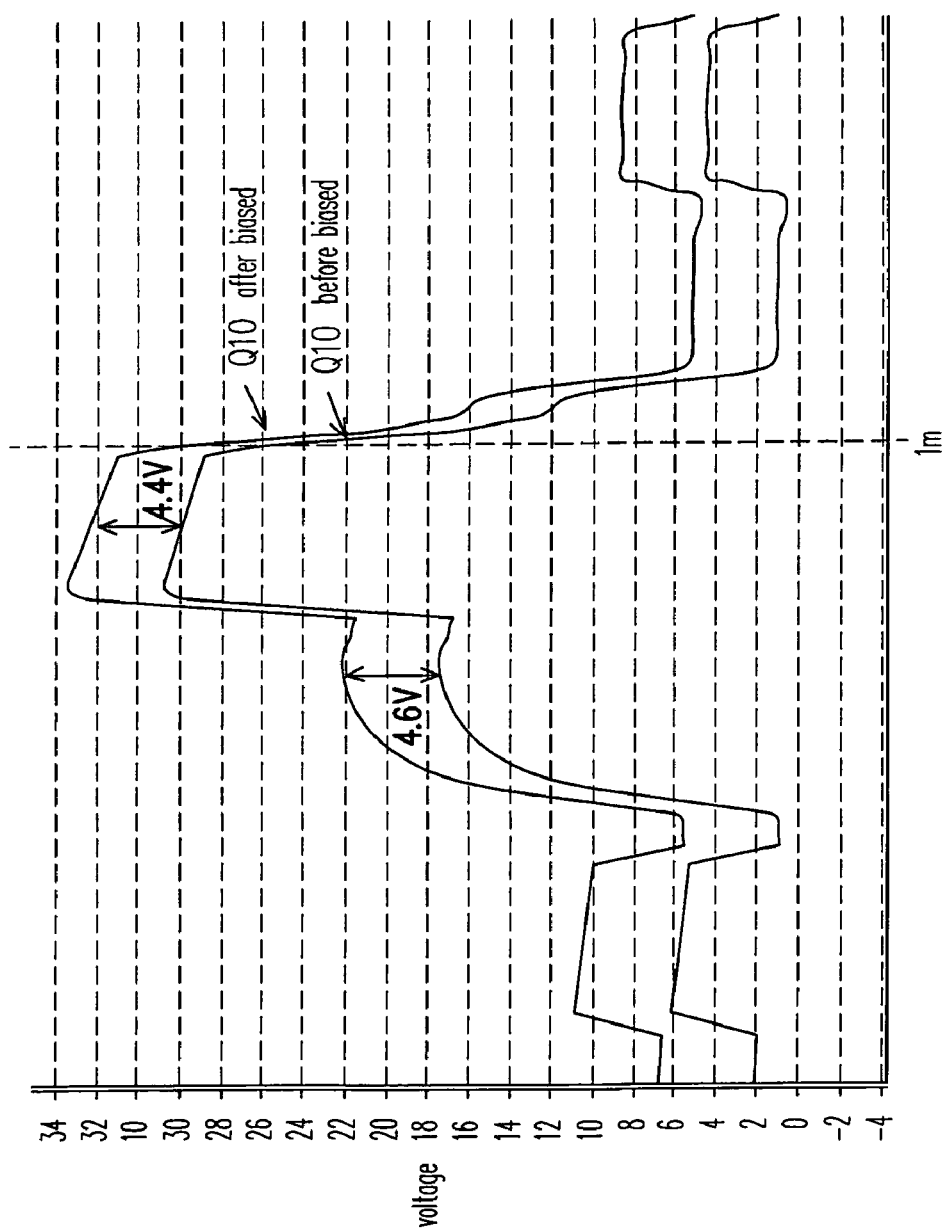
FIG. 12A is a diagram showing waveforms at the node Q in the 10th stage level shifter before and after being biased.
Figure 12B:
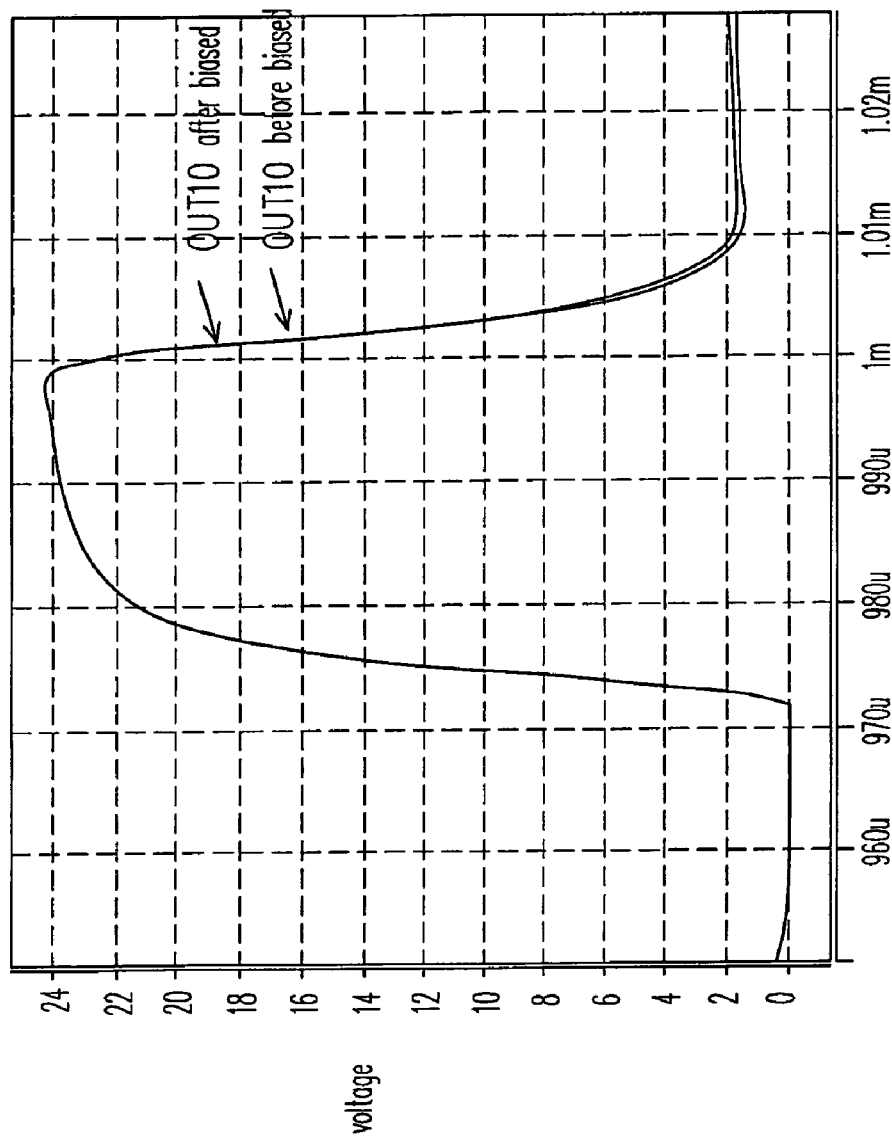
FIG. 12B is a diagram showing output waveforms of the 10th stage level shifter before and after being biased.

Next, changes of the threshold voltage $V_{th}$ of the driving transistor M14 in the gate driver are taken into account. FIG. 12A is a diagram showing waveforms at the node Q in the 10th stage level shifter in the initial condition and under the circumstance that $\Delta(V_{th})_{M8}$ is 4.5 V after being biased for an operation time s. It can be found that the potential $V_Q$ at the node is also raised by 4.5 V after being biased. FIG. 12B is a diagram showing output waveforms of the 10th stage level shifter before and after being biased. It can be clearly seen from FIG. 12B that the waveforms of the tenth stage output signal OUT10 before and after being biased are completely consistent without any obvious variation. Therefore, the circuit of this embodiment is indeed capable of fully compensating the output signal.

In summary, since a memory capacitor is employed to memorize a threshold voltage of a driving transistor before the activation of the level shifter, changes of the threshold voltage in the output signal can be avoided. In this way, the output signals of the driving voltage and driving current are nearly irrelevant to the threshold voltage of the driving transistor. As a result, a stable driving can be achieved, leading to a more stable display. Furthermore, the present invention is also applicable to any circuit that might be affected by changes of a threshold voltage.

It will be apparent to those skilled in the art that various modifications and variations can be made to the structure of the present invention without departing from the scope or spirit of the invention. In view of the foregoing, it is intended that the present invention cover modifications and variations of this invention provided they fall within the scope of the following claims and their equivalents.

What is claimed is:

1. A level shifter, wherein multiple stages of the level shifters are suitable to be serially-connected into a gate drive circuit, and each stage comprising an output end coupled to an input end of a next stage level shifter, and a reset end for receiving an output signal of the next stage level shifter, the level shifter comprising:
    a first node and a second node;
    a driving transistor, provided with a gate, a source, and a drain, wherein the gate is coupled to the first node, the drain is coupled to a clock signal, and the source functioning as the output end outputs an output signal;
    a reset transistor, provided with a gate, a source, and a drain, wherein the gate receives the output signal of the next stage level shifter as a reset signal, the source is coupled to a first low-potential voltage, and the drain is coupled to the first node;
    a charge/discharge circuit, for receiving an input signal and a control signal, and coupled to the second node;
    a threshold voltage detector, for receiving the control signal, and coupled to the first node and the source of the driving transistor; and
    a memory capacitor, provided with a first end and a second end respectively coupled to the first node and the second node, for memorizing a threshold voltage of the driving transistor.

2. The level shifter according to claim 1, wherein the charge/discharge circuit further comprises:
    a first transistor, provided with a gate, a source, and a drain, wherein the gate is coupled to the input signal, the drain is coupled to a high-potential voltage, and the source is coupled to the second node; and
    a second transistor, provided with a gate, a source, and a drain, wherein the gate is coupled to the control signal, the drain is coupled to the second node, and the source is coupled to a second low-potential voltage.

3. The level shifter according to claim 2, wherein the gate and the drain of the first transistor are coupled, for receiving the input signal.

4. The level shifter according to claim 2, wherein the first low-potential voltage is different from the second low-potential voltage.

5. The level shifter according to claim 2, wherein the first low-potential voltage is the same as the second low-potential voltage.

6. The level shifter according to claim 1, wherein the memory capacitor is a transistor-based capacitor or a metal-insulator-metal capacitor.

7. A level shifter, wherein multiple stages of the level shifters are suitable to be serially-connected into a gate drive circuit, each stage comprising an output end coupled to an input end of a next stage level shifter, and a reset end for receiving an output signal of the next stage level shifter, the level shifter comprising:

a first node and a second node;

a driving transistor, provided with a gate, a source, and a drain, wherein the gate is coupled to the first node, the drain is coupled to a clock signal, and the source is coupled to an output signal;

a reset transistor, provided with a gate, a source, and a drain, wherein the gate receives the output signal of the next stage level shifter as a reset signal, the source is coupled to a first low-potential voltage, and the drain is coupled to the second node;

a charge/discharge circuit, for receiving an input signal and a control signal, and coupled to a high-potential voltage, a second low-potential voltage, and the second node;

a threshold voltage detector, for receiving the control signal, and coupled to the first node and the source of the driving transistor; and a memory capacitor, provided with a first end and a second end respectively coupled to the first node and the second node, for memorizing a threshold voltage of the driving transistor.

8. The level shifter according to claim 7, wherein the charge/discharge circuit further comprises:

a first transistor, provided with a gate, a source, and a drain, wherein the gate is coupled to the input signal, the drain is coupled to the high-potential voltage, and the source is coupled to the second node; and a second transistor, provided with a gate, a source, and a drain, wherein the gate is coupled to the control signal, the drain is coupled to the second node, and the source is coupled to the second low-potential voltage.

9. The level shifter according to claim 8, wherein the gate and the drain of the first transistor are coupled, and the input signal functions as a high-potential voltage level.

10. The level shifter according to claim 7, wherein the first low-potential voltage is different from the second low-potential voltage.

11. The level shifter according to claim 7, wherein the first low-potential voltage is the same as the second low-potential voltage.

12. The level shifter according to claim 7, wherein the memory capacitor is a transistor-based capacitor or a metal-insulator-metal capacitor.

13. A level shifter, wherein multiple stages of the level shifters are suitable to be serially-connected into a gate drive circuit, each comprising an output end coupled to an input end of a next stage level shifter, and a reset end for receiving an output signal of the next stage level shifter, the level shifter comprising:

a first node and a second node;

a driving transistor, provided with a gate, a source, and a drain, wherein the gate is coupled to the first node, the drain is coupled to a clock signal, and the source functioning as the output end outputs an output signal;

a reset transistor, provided with a gate, a source, and a drain, wherein the gate receives the output signal of the next stage level shifter as a reset signal, the source is coupled to a first low-potential voltage, and the drain is coupled to the first node;

a charge/discharge circuit, used for receiving an input signal, a first control signal, and a second control signal, and coupled to a second low-potential voltage and the second node;

a threshold voltage detector, used for receiving the first control signal and the second control signal, and coupled to the first node and the source of the driving transistor; and a memory capacitor, provided with a first end and a second end respectively coupled to the first node and the second node, for memorizing a threshold voltage of the driving transistor.

14. The level shifter according to claim 13, wherein the charge/discharge circuit further comprises:

a first transistor, provided with a gate, a source, and a drain, wherein the gate is coupled to the drain for receiving the input signal, and the source is coupled to the second node;

a second transistor, provided with a gate, a source, and a drain, wherein the gate is coupled to the first control signal, and the drain is coupled to the second node; and a third transistor, provided with a gate, a source, and a drain, wherein the gate is coupled to the second control signal, and the drain is coupled to the second node.

15. The level shifter according to claim 14, wherein the sources of the second transistor and the third transistor are coupled to the same low-potential voltage.

16. The level shifter according to claim 14, wherein the sources of the second transistor and the third transistor are coupled to different low-potential voltages.

17. The level shifter according to claim 13, wherein the threshold voltage detector further comprises:

a fourth transistor, provided with a gate, a source, and a drain, wherein the gate is coupled to the first control signal, the drain is coupled to a high-potential voltage, and the source is coupled to the first node;

a fifth transistor, provided with a gate, a source, and a drain, wherein the gate is coupled to the second control signal, and the source is coupled to the first node; and a sixth transistor, provided with a gate, a source, and a drain, wherein the gate is coupled to the first node and the gate of the driving transistor, the drain is coupled to the drain of the fifth transistor, and the source is coupled to the source of the driving transistor.

18. The level shifter according to claim 13, wherein the gate and the drain of the fourth transistor are further coupled together, for receiving the first control signal.

19. The level shifter according to claim 13, further comprising a seventh transistor provided with a gate, a source, and a drain, wherein the gate and the drain are both coupled to the source of the driving transistor, and the source is connected to a third low-potential voltage.

20. The level shifter according to claim 13, further comprising an eighth transistor provided with a gate, a source, and a drain, wherein the gate is coupled to the gate of the driving transistor, the drain is coupled to the clock signal, and the source is coupled to a pixel end.

21. The level shifter according to claim 13, wherein the memory capacitor is a transistor-based capacitor or a metal-insulator-metal capacitor.

22. The level shifter according to claim 13, wherein the first low-potential voltage is different from the second low-potential voltage.

23. The level shifter according to claim 13, wherein the first low-potential voltage is the same as the second low-potential voltage.

24. A level shifter, wherein multiple stages of the level shifters are suitable to be serially-connected into a gate drive circuit, each stage comprising an output end coupled to an input end of a next stage level shifter, and a reset end for receiving an output signal of the next stage level shifter, the level shifter comprising:

a first node and a second node;

a driving transistor, provided with a gate, a source, and a drain, wherein the gate is coupled to the first node, the drain is coupled to a clock signal, and the source functioning as the output end outputs an output signal;

a reset transistor, provided with a gate, a source, and a drain, wherein the gate receives the output signal of the next stage level shifter as a reset signal, the source is coupled to a low-potential voltage, and the drain is, coupled to the first node;

a charge circuit, for receiving an input signal, and coupled to the second node;

a threshold voltage detector, for receiving the control signal, and coupled to the first node, the second node, and the source of the driving transistor; and a memory capacitor, provided with a first end and a second end respectively coupled to the first node and the second node, for memorizing a threshold voltage of the driving transistor.

25. The level shifter according to claim 24, wherein the charge circuit is a first transistor provided with a gate, a source, and a drain, the gate is coupled to the input signal, the drain is coupled to a high-potential voltage, and the source is coupled to the second node.

26. The level shifter according to claim 25, wherein the gate and the drain of the first transistor are coupled, for receiving the input signal.

27. The level shifter according to claim 24, wherein the memory capacitor is a transistor-based capacitor or a metal-insulator-metal capacitor.

\* \* \* \* \*